(12) United States Patent
Asai et al.

(10) Patent No.: US 6,828,602 B2
(45) Date of Patent: Dec. 7, 2004

(54) BIPOLAR TRANSISTOR AND METHOD MANUFACTURE THEREOF

(75) Inventors: Akira Asai, Osaka (JP); Teruhito Ohnishi, Hirakata (JP); Takeshi Takagi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/031,445

(22) PCT Filed: May 23, 2001

(86) PCT No.: PCT/JP01/04344

§ 371 (c)(1),
(2), (4) Date: Jan. 22, 2002

(87) PCT Pub. No.: WO01/91162

PCT Pub. Date: Nov. 29, 2001

(65) Prior Publication Data

US 2003/0006484 A1 Jan. 9, 2003

(30) Foreign Application Priority Data

May 23, 2000 (JP) ........................... 2000-151044

(51) Int. Cl.[7] ................ H01L 31/072; H01L 31/109; H01L 31/0328; H01L 31/0336; H01L 27/102
(52) U.S. Cl. .................. 257/197; 257/191; 257/200; 257/592
(58) Field of Search ................ 257/191, 197, 257/200, 592

(56) References Cited

U.S. PATENT DOCUMENTS 5,302,841 A * 4/1994 Yamazaki .................. 257/197
5,440,152 A * 8/1995 Yamazaki .................. 257/197
5,656,514 A * 8/1997 Ahlgren et al. ............ 438/320
5,962,880 A * 10/1999 Oda et al. .................. 257/198

FOREIGN PATENT DOCUMENTS

| EP | 0551185 | 7/1993 |
| EP | 0768716 | 4/1997 |
| JP | 9-115921 | 4/1997 |
| JP | 5-102177 | 4/1999 |
| JP | 2000-58555 | 2/2000 |

OTHER PUBLICATIONS

C.A. King et al., "Very Low Cost Graded SiGe Base Bioplar Transistors for a High Performance Modular BiCMOS Process", International Electron Device Meeting, Dec. 1999.

* cited by examiner

Primary Examiner—Eddie Lee
Assistant Examiner—Samuel A Gebremariam
(74) Attorney, Agent, or Firm—McDermott, Will & Emery

(57) ABSTRACT

A SiGe spacer layer 151, a graded SiGe base layer 152 including boron, and an Si-cap layer 153 are sequentially grown through epitaxial growth over a collector layer 102 on an Si substrate. A second deposited oxide film 112 having a base opening portion 118 and a P+ polysilicon layer 115 that will be made into an emitter connecting electrode filling the base opening portion are formed on the Si-cap layer 153, and an emitter diffusion layer 153a is formed by diffusing phosphorus into the Si-cap layer 153. When the Si-cap layer 153 is grown, by allowing the Si-cap layer 153 to include boron only at the upper part thereof by in-situ doping, the width of a depletion layer 154 is narrowed and a recombination current is reduced, thereby making it possible to improve the linearity of the current characteristics.

5 Claims, 13 Drawing Sheets

BIPOLAR TRANSISTOR AND METHOD MANUFACTURE THEREOF

TECHNICAL FIELD

The present invention relates to a hetero junction type bipolar transistor and a fabrication method thereof, and more particularly to a measure to improve a linearity of current characteristics.

BACKGROUND ART

Recently, the development has been advancing at a high pitch for a hetero bipolar transistor (HBT) that realizes an operation at a high frequency region with better conduction characteristics conferred by incorporating a hetero junction structure, such as Si/SiGe and Si/SiC, into a bipolar transistor fabricated on a silicon substrate. The HBT uses a Si/SiGe hetero junction structure obtained by allowing epitaxial growth of a SiGe layer on a Si substrate, so that it realizes a transistor operating at a high frequency region at which a conventional transistor cannot operate unless it uses a compound semiconductor substrate, such as GaAs. The HBT is made of materials having a good affinity for a general silicon process, such as a Si substrate and a SiGe layer, which provides remarkable advantages in achieving high integration and a low cost. In particular, integrating a HBT and a MOS transistor (MOSFET) by forming the both on a common Si substrate makes it possible to fabricate a high-performance BiCMOS device. Moreover, the BiCMOS device is expected to serve as a system LSI applicable to communication systems.

FIG. 10 is a cross section showing a structure of a conventional HBT. As is shown in the drawing, a top portion of a Si substrate 500 having a (001) plane forms a retrograde well 501 with a depth of 1 $\mu$m including a N-type impurity, such as phosphorous, introduced by the epitaxial growth method, ion implantation method, etc. Also, for the isolation, provided are a shallow trench 503 filled with silicon oxide and a deep trench 504 formed from an undoped polysilicon film 505 and a silicon dioxide film 506 surrounding the same. The trenches 503 and 504 have depths of approximately 0.35 $\mu$m and 2 $\mu$m, respectively.

Also, a collector layer 502 is provided in the Si substrate 500 at a region sandwiched by the trenches 503, and a N+ collector connecting layer 507 is provided in the Si substrate 500 at a region separated from the collector layer 502 by the shallow trench 503 for establishing a contact with an electrode of the collector layer 502 through the retrograde well 501.

Also, a first deposited oxide film 508 with a thickness of approximately 30 nm having a collector opening portion 510 is formed on the Si substrate 500, and a Si/Si$_{1-x}$Ge$_x$ layer 511 is formed by depositing a Si$_{1-x}$Ge$_x$ layer doped with a P-type impurity with a thickness of approximately 60 nm and a Si film with a thickness of approximately 10 nm on the top surface of the Si substrate 500 at a portion exposed to the collector opening portion 510. The bottom portion of the Si/Si$_{1-x}$Ge$_x$ layer 511 at the center thereof (a region below a base opening portion 518, which will be described bellow) functions as an intrinsic base 519. On the other hand, the top portion of the Si/Si$_{1-x}$Ge$_x$ layer 511 at the center thereof functions as an emitter layer.

A second deposited oxide film 512 with a thickness of approximately 30 nm to serve as an etch stopper is provided on the Si/Si$_{1-x}$Ge$_x$ layer 511 and the first deposited oxide film 508, and the second deposited oxide film 512 is provided with a base junction opening portion 514 and a base opening portion 518. Provided next are a P+ polysilicon layer 515 with a thickness of approximately 150 nm that fills in the base junction opening portion 514 and extends over the second deposited oxide film 512, and a third deposited oxide film 517. An extrinsic base 516 is constructed by the Si/Si$_{1-x}$Ge$_x$ layer 511 except for the region below the base opening portion 518 and the P+ polysilicon layer 515.

Also, the P+ polysilicon layer 515 and the third deposited oxide film 517 are opened at portions positioned above the base opening portion 518 in the second deposited oxide film 512, and a fourth deposited oxide film 520 with a thickness of approximately 30 nm is formed on the side surface of the P+ polysilicon layer 515. Further, a sidewall 521 made of polysilicon with a thickness of approximately 100 nm is provided on the fourth deposited oxide film 520. Then, an N+ polysilicon layer 529 is provided to fill the base opening portion 518 and to extend over the third deposited oxide film 517, and the N+ polysilicon layer 529 thus functions as an emitter connecting electrode. The fourth deposited oxide film 520 not only electrically isolates the P+ polysilicon layer 515 from the N+ polysilicon layer 529, but also prevents out-diffusion of the impurity from the P+ polysilicon layer 515 into the N+ polysilicon layer 529. Also, the third deposited oxide film 517 electrically isolates the top surface of the P+ polysilicon layer 515 from the N+ polysilicon layer 529.

Further, a Ti silicide layer 524 is formed on the surfaces of the collector connecting layer 507, P+ polysilicon layer 515, and N+ polysilicon layer 529, and the outside sidewalls of the N+ polysilicon layer 529 and the P+ polysilicon layer 515 are covered with a sidewall 523. The entire substrate is covered with an inter-layer insulator film 525, through which contact holes that respectively reach the Ti silicide layer 524 formed on the N+ collector connecting layer 507, P+ polysilicon layer 515 as a part of the extrinsic base, and N+ polysilicon layer 529 functioning as the emitter connecting electrode are provided. Then, each contact hole is filled with a W plug 526 and is provided with a metal wiring 527 connected to the W plug 526 and extending over the inter-layer insulator film 525.

Problems to be Solved

However, the above-discussed conventional HBT or SiGe-BiCMOS has problems as follows.

FIG. 11(a) is a view showing dependencies of a base current and a collector current on a base-emitter voltage, that is, so-called Gummel characteristics of the conventional HBT. In the drawing, the horizontal axis represents the base-emitter voltage (V), and the vertical axis represents the base current or collector current (A) (logarithmic scales). As is shown in the drawing, the parallel relation between the collector current characteristics curve and the base current characteristics curve is lost at a low base-emitter voltage region, and there is an excessive base current. In short, there is an inconvenience that the linearity of the current characteristics is deteriorated in the low bias region of the HBT.

Causes of such an inconvenience are checked, and one of the causes is found to be a recombination current generated excessively at a region underneath the second deposited oxide film 112 in the Si layer. It is assumed that such an excessive recombination current is generated because a depletion layer at the pn junction region in the Si layer is not formed in a satisfactory shape.

FIGS. 12(a) and 12(b) are an enlarged partial cross section showing an emitter-base junction region in the conventional HBT, and a doping profile of boron along a cross section in the vicinity of the emitter-base junction region, respectively. As shown in FIG. 12(a), the Si/Si$_{1-x}$Ge$_x$ layer 511 is formed by sequentially depositing an undoped SiGe spacer layer 551 with a Ge content of 15%, a P-type graded SiGe base layer 552 including boron at a high concentration with a Ge content continuously changing from 15% at the lower end to 0% at the upper end, and an undoped Si-cap layer 553. The Si-cap layer 553 is provided with an N-type emitter diffusion layer 553a formed by introducing phosphorous out-diffused from the N+ polysilicon layer 529 (emitter connecting electrode) at a high concentration at a region directly below the base opening portion 518 and in contact with the N+ polysilicon layer 529. Then, a peripheral layer 553b (especially, the bottom portion) of the Si-cap layer 511 surrounding the emitter diffusion layer 553a includes boron out-diffused from the graded SiGe layer 552, which makes the peripheral layer 553b into the P-type. Hence, there is a pn junction region between the emitter diffusion layer 553a and the peripheral layer 553b in the Si-cap layer 551, and a depletion layer 554 expands along the both sides of the metallurgical pn junction interface in the pn junction region. At this point, the depletion layer 554 has a broader width in the upper part of the Si-cap layer 551. Hence, a recombination current generated from carriers recombined within the depletion layer 554 increases, which is assumed to cause deterioration in the linearity of the current characteristics as shown in FIG. 11(a).

According to *Physics of Semiconductor Devices*, S. M. Sze, John Wiley & Sons, Inc., 1981, pp. 89–94, the recombination current Irec is expressed as:

$$\text{Irec} = S \int q \cdot U \cdot dx \ (x = 0 \text{ to } W),$$

where S is the area of the pn junction, W is the depletion layer width, U is a recombination rate, and q is the elemental charge.

Here, the recombination rate U is determined by parameters of deep level traps in the depletion layer, such as densities at deep level traps, depths of the levels of the traps, the capture cross sections of the traps, and so on. The above expression indicates that a recombination current increases as the width of the depletion layer (a distance from the first depletion layer end to the second depletion layer end) broadens, because deep level traps in the depletion region between a first depletion layer edge and a second depletion layer edge in FIG. 12(a) work as recombination centers.

In other words, as shown in FIG. 12(a), according to the conventional bipolar transistor discussed above, it is assumed that the recombination current Irec increases because the depletion region 554 becomes wider particularly in the upper part of the Si-cap layer 551.

In view of the foregoing, the present invention has an object to provide a bipolar transistor having a satisfactory linearity of the current characteristics and a fabrication method thereof by taking a means to improve a doping profile of an impurity in the Si-cap layer in the HBT.

DISCLOSURE OF THE INVENTION

In order to reduce the recombination current Irec by reducing the width of the depletion layer, the present invention takes means as follows.

A bipolar transistor of the present invention includes: a first semiconductor layer to be a collector layer formed on a substrate and including an impurity of a first conductive type; a second semiconductor layer to be a base layer formed on the first semiconductor layer and including an impurity of a second conductive type; a third semiconductor layer formed on the second semiconductor layer from a material having a bandgap different from a bandgap of the second semiconductor layer; an insulator film provided on the third semiconductor layer; an opening portion formed through the insulator film to reach the third semiconductor layer; and an emitter connecting electrode made of a conductor material and brought into contact with the third semiconductor layer by filling the opening portion in the insulator film, wherein the third semiconductor layer includes an emitter diffusion layer of the first conductive type positioned below the opening portion, and a peripheral layer including the impurity of the second conductive type at least in an upper part thereof at a region located at a side of the emitter diffusion layer.

Accordingly, the pn junction portion is formed between the emitter diffusion layer including the impurity of the first conductive type at a high concentration and the third semiconductor layer including the impurity of the second conductive type at a high concentration in the upper part of the third semiconductor layer. Hence, the width of the depletion layer formed at the pn junction is narrowed, and a quantity of carriers recombined within the depletion layer is reduced. Consequently, because the recombination current is reduced, the linearity of the current characteristics in a hetero junction type bipolar transistor is improved.

It may be arranged in such a manner that the insulator film is formed from a silicon dioxide film doped with the impurity of the second conductive type, and the impurity of the second conductive type included in at least a part of the upper part of the third semiconductor layer is the impurity of the second conductive type out-diffused from the insulator film.

It may be arranged in such a manner so as to further include a polysilicon film, doped with the impurity of the second conductive type and provided so as to contact the third semiconductor layer at a portion outside of the underlying insulator film and to extend over the insulator film, for functioning as a base connecting electrode, so that the impurity of the second conductive type included in at least a part of the upper part of the third semiconductor layer is the impurity of the second conductive type out-diffused from the polysilicon film by passing through the insulator film.

By arranging in such a manner that the impurity of the first conductive type in the emitter diffusion layer of the third semiconductor layer is the impurity of the first conductive type out-diffused from the emitter connecting electrode, it is possible to obtain an emitter diffusion layer using inversion of the conductive types in the third semiconductor layer.

By arranging in such a manner that: the substrate is a silicon substrate; the first semiconductor layer is a Si layer; the second semiconductor layer is a SiGe layer or a SiGeC layer; and the third semiconductor layer is a Si layer, it is possible to obtain a SiGe-HBT that can be readily fabricated by using the Si process.

A first bipolar transistor of the present invention includes: a step (a) of forming a second semiconductor layer to be a base layer including a second conductive type impurity on a first semiconductor layer that is formed on a substrate to be a collector layer including a first conductive type impurity; a step (b) of forming, on the second semiconductor layer, a third semiconductor layer, including the second conductive type impurity at least at an upper part thereof, through epitaxial growth from a material having a bandgap different from a bandgap of the second semiconductor layer; a step (c) of depositing an insulator film on the substrate after the step (b); a step (d) of forming an opening portion through the insulator film, to reach the third semiconductor layer; and a step (e) of forming an emitter diffusion layer in the third semiconductor layer at a region below the opening portion by introducing the first conductive type impurity.

According to this method, it is possible to control a concentration of the second conductive type impurity doped into the upper part of the third semiconductor layer at a relatively high accuracy by conducting in-situ doping in the third semiconductor layer.

A second fabrication method of a bipolar transistor of the present invention includes: a step (a) of forming a second semiconductor layer to be a base layer including a second conductive type impurity on a first semiconductor layer that is formed on a substrate to be a collector layer including a first conductive type impurity; a step (b) of forming, on the second semiconductor layer, a third semiconductor layer through epitaxial growth from a material having a bandgap different from a bandgap of the second semiconductor layer; a step (c) of depositing an insulator film including the second conductive type impurity on the substrate after the step (b); a step (d) of forming an opening portion through the insulator film to reach the third semiconductor layer; and a step (e) of forming an emitter diffusion layer in the third semiconductor layer at a region below the opening portion by introducing the first conductive type impurity, so that the second conductive type impurity is doped into an upper part of the third semiconductor layer from the insulator film by treatments after the step (c).

According to this method, it is possible to dope the second conductive type impurity into the upper part of the third semiconductor layer by relatively simple steps.

A third fabrication method of a bipolar transistor of the present invention includes: a step (a) of forming a second semiconductor layer to be a base layer including a second conductive type impurity on a first semiconductor layer that is formed on a substrate to be a collector layer including a first conductive type impurity; a step (b) of forming, on the second semiconductor layer, a third semiconductor layer through epitaxial growth from a material having a bandgap different from a bandgap of the second semiconductor layer; a step (c) of depositing an insulator film on the substrate after the step (b); a step (d) of depositing a conductor film including the second conductive type impurity on the substrate and forming an opening portion through the conductor film to reach the insulator film; a step (e) of forming a sidewall made of an insulating material for covering a side surface of the opening portion in the first conductor film; a step (f) of forming an opening portion through the insulator film to reach the third semiconductor layer after the step (e); and a step (g) of forming an emitter diffusion layer in the third semiconductor layer at a region located below the opening portion by introducing the first conductive type impurity, so that the second conductive type impurity is doped into an upper part of the third semiconductor layer from the conductor film by passing through the insulator film by treatments after the step (d).

According to this method, it is possible to dope the second conductive type impurity into the upper part of the third semiconductor layer only at a region excluding a region that will be made into an emitter diffusion layer. Hence, a concentration of the second conductive type impurity can be set as desired regardless of a concentration of the first conductive type impurity in the emitter diffusion layer.

By further including, after the step (f) and before the step (g), a step of depositing, on the substrate, another conductor film different from the above conductor film, and then patterning this another conductor film to form an emitter connecting electrode including the first conductive type impurity in such a manner so as to fill in the opening portion in the insulator film and to extend over the insulator film, it is possible to fabricate a HBT by using the double-polysilicon sequence.

BEST MODE FOR CARRYING OUT THE INVENTION

Figure 1:
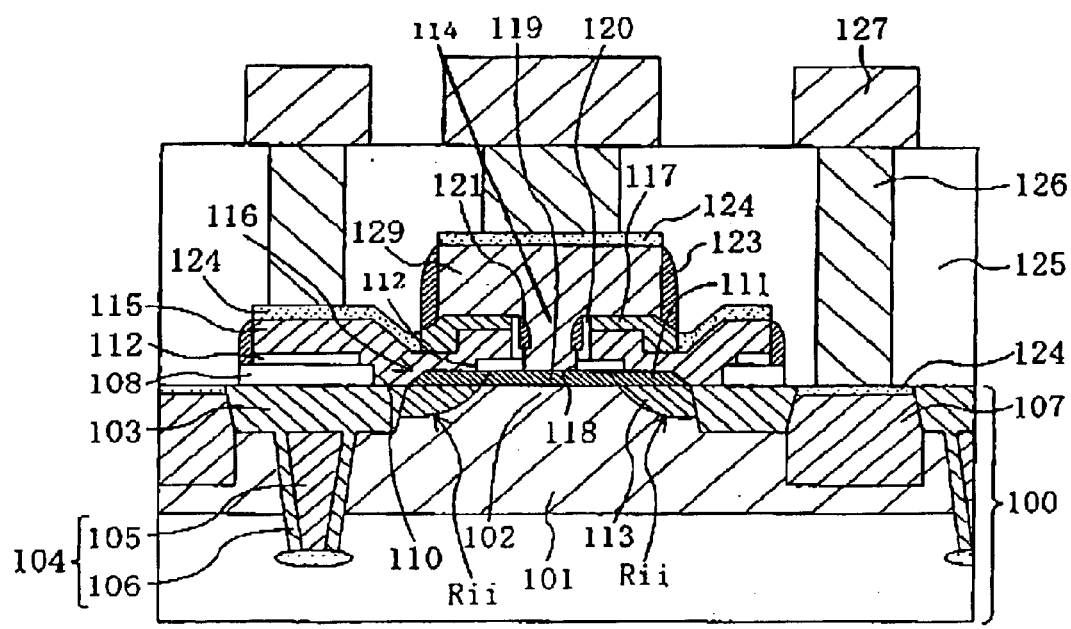
FIG. 1 is a cross section showing a structure of a SiGe-HBT as a basic example of the present invention.

FIG. 1 is a cross section showing a structure of a SiGe-HBT, which is a basic example of the present invention.

As shown in the drawing, a top portion of a Si substrate 100 having a (001) plane forms a retrograde well 101 with a depth of 1 µm including an N-type impurity, such as phosphorous, introduced by the epitaxial growth method, ion implantation method, etc. A concentration of the N-type impurity at a region in the vicinity of the surface of the Si substrate 100 is arranged to be approximately $1 \times 10^{17}$ atoms·cm$^{-3}$. Also, for the isolation, provided are a shallow trench 103 filled with silicon oxide and a deep trench 104 formed from an undoped polysilicon film 105 and a silicon dioxide film 106 surrounding the same. The trenches 103 and 104 have depths of approximately 0.35 µm and 2 µm, respectively.

Also, a collector layer 102 is provided in the Si substrate 100 at a region sandwiched by the trenches 103, and an N+ collector connecting layer 107 is provided in the Si substrate 100 at a region separated from the collector layer 102 by the shallow trench 103 for establishing a contact with an electrode of the collector layer 102 through the retrograde well 101.

Also, a first deposited oxide film 108 with a thickness of approximately 30 nm having a collector opening portion 110 is formed on the Si substrate 100, and a Si/Si$_{1-x}$Ge$_x$ layer 111, formed by depositing a Si$_{1-x}$Ge$_x$ layer doped with a P-type impurity with a thickness of approximately 80 nm and a Si film with a thickness of approximately 40 nm, is formed on the top surface of the Si substrate 100 at a portion exposed to the collector opening portion 110. The Si/Si$_{1-x}$Ge$_x$ layer 111 is formed on the Si substrate 100 by selective growth only at a portion exposed to the collector opening portion 110. The bottom portion of the Si/Si$_{1-x}$Ge$_x$ layer 111 at the center thereof (a region below a base opening portion 118, which will be described below) functions as an intrinsic base 119. On the other hand, the top portion of the Si/Si$_{1-x}$Ge$_x$ layer 111 at the center thereof functions as an emitter layer. The structure of the Si/Si$_{1-x}$Ge$_x$ layer 111 will be described more in detail below. Also, an extrinsic base implantation region Rii is formed by ion implantations of boron across the surface portions of the Si/Si$_{1-x}$Ge$_x$ layer 111 and the retrograde well 101, and as a part of the extrinsic base implantation region Rii, a junction leakage preventing layer 113 is formed on the surface portion of the retrograde well 101 at a concentration of approximately $3 \times 10^{17}$ atoms·cm$^{-3}$.

A second deposited oxide film 112 with a thickness of approximately 30 nm to serve as an etch stopper is provided on the Si/Si$_{1-x}$Ge$_x$ layer 111 and the first deposited oxide film 108, and the second deposited oxide film 112 is provided with a base junction opening portion 114 and a base opening portion 118. Provided are a P+ polysilicon layer 115 with a thickness of approximately 150 nm that fills in the base junction opening portion 114 and extends over the second deposited oxide film 112, and a third deposited oxide film 117. An extrinsic base 116 is formed from the Si/Si$_{1-x}$Ge$_x$ layer 111 except for the region below the base opening portion 118 and the P+ polysilicon layer 115.

Also, the P+ polysilicon layer 115 and the third deposited oxide film 117 are opened at portions positioned above the base opening portion 118 in the second deposited oxide film 112, and a fourth deposited oxide film 120 with a thickness of approximately 30 nm is formed on the side surface of the P+ polysilicon layer 115. Further, a sidewall 121 made of polysilicon with a thickness of approximately 100 nm is provided on the fourth deposited oxide film 120. Then, an N+ polysilicon layer 129 is provided so as to fill the base opening portion 118 and to extend over the third deposited oxide film 117, and the N+ polysilicon layer 129 thus functions as an emitter connecting electrode. The fourth deposited oxide film 120 not only electrically isolates the P+ polysilicon layer 115 from the N+ polysilicon layer 129, but also prevents out-diffusion of the impurity from the P+ polysilicon layer 115 into the N+ polysilicon layer 129. Also, the third deposited oxide film 117 electrically isolates the top surface of the P+ polysilicon layer 115 from the N+ polysilicon layer 129. Further, the outer surfaces of the N+ polysilicon layer 129 and the P+ polysilicon layer 115 are covered with a sidewall 123.

Furthermore, a Ti silicide layer 124 is formed on the surfaces of the collector connecting layer 107, P+ polysilicon layer 115, and N+ polysilicon layer 129.

The entire substrate is covered with an inter-layer insulator film 125, through which contact holes that respectively reach the Ti silicide layer 124 formed on the N+ collector connecting layer 107, P+ polysilicon layer 115 as a part of the extrinsic base, and N+ polysilicon layer 129 functioning as the emitter connecting electrode are provided. Each contact hole is filled with a W plug 126 and is provided with a metal wiring 127 connected to the W plug 126 and extending over the inter-layer insulator film 125.

Figure 2A:
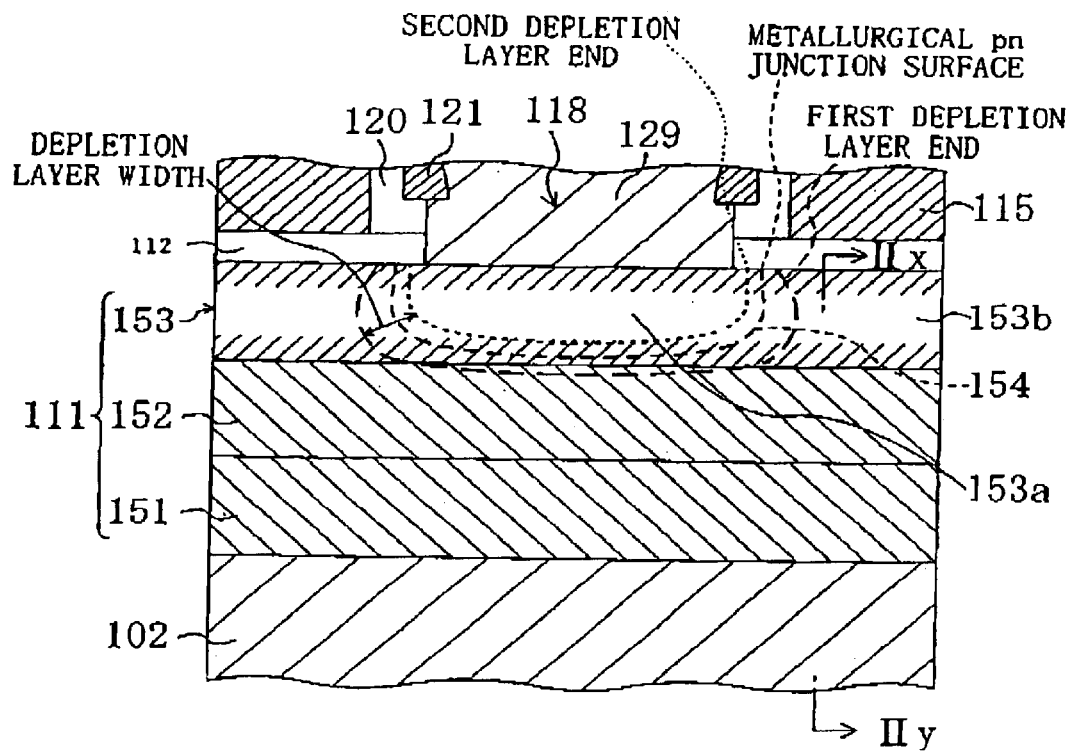
FIGS. 2(a) and 2(b) are an enlarged partial cross section showing an emitter-base junction of FIG. 1, and a view showing a doping profile of boron along a cross section in the vicinity of the emitter-base junction, respectively.
Figure 2B:
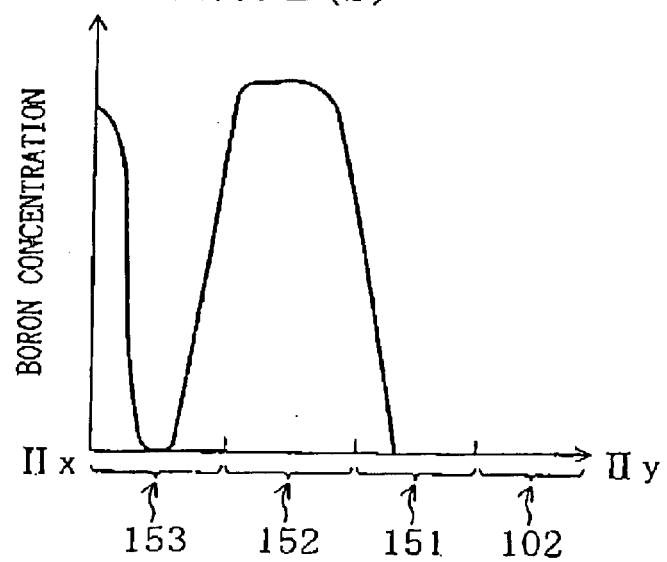

FIGS. 2(a) and 2(b) are an enlarged partial cross section showing an emitter-base junction portion of FIG. 1, and a doping profile of boron along a cross section in the vicinity of the emitter-base junction, respectively. As shown in FIG. 2(a), the Si/Si$_{1-x}$Ge$_x$ layer 111 is formed by sequentially depositing an undoped SiGe spacer layer 151 with a thickness of approximately 40 nm and with a Ge content of 15%, a graded SiGe base layer 152 including boron at a concentration of approximately $4 \times 10^{18}$ atoms·cm$^{-3}$ with a thickness of approximately 40 nm and with a Ge content continuously changing from 15% at the lower end to 0% at the upper end, and a Si-cap layer 153 partially doped with boron with a thickness of approximately 40 nm. The Si-cap layer 153 is provided with an N-type emitter diffusion layer 153a formed by introducing phosphorous out-diffused from the N+ polysilicon layer 129 (emitter connecting electrode) at a high concentration at a region in contact with the N+ polysilicon layer 129. The emitter diffusion layer 153a is doped with phosphorous toward a depth direction of the substrate with a distribution ranging approximately from $1 \times 10^{20}$ atoms·cm$^{-3}$ to $1 \times 10^{17}$ atoms·cm$^{-3}$.

Figure 12A:
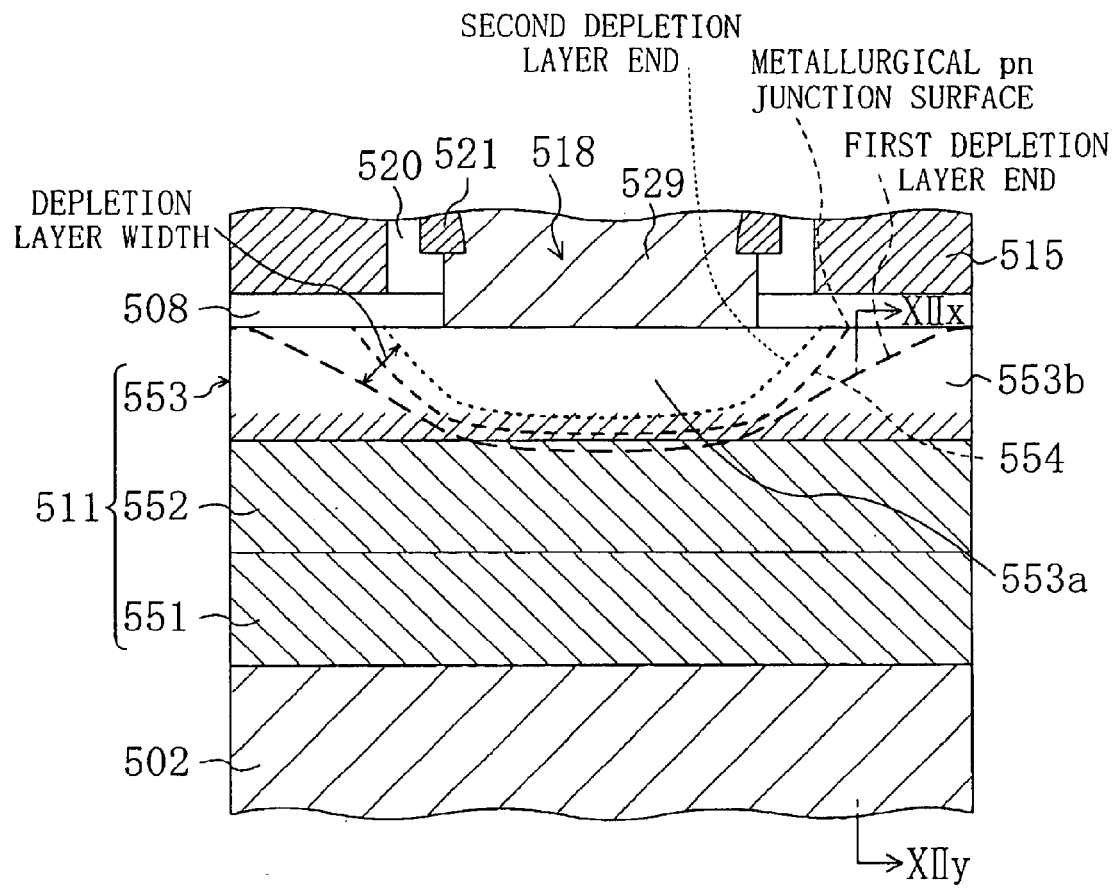
FIGS. 12(a) and 12(b) are an enlarged partial cross section showing an emitter-base junction in a conventional HBT and a view showing a doping profile of boron along a cross section in the vicinity of the emitter-base junction, respectively.
Figure 12B:
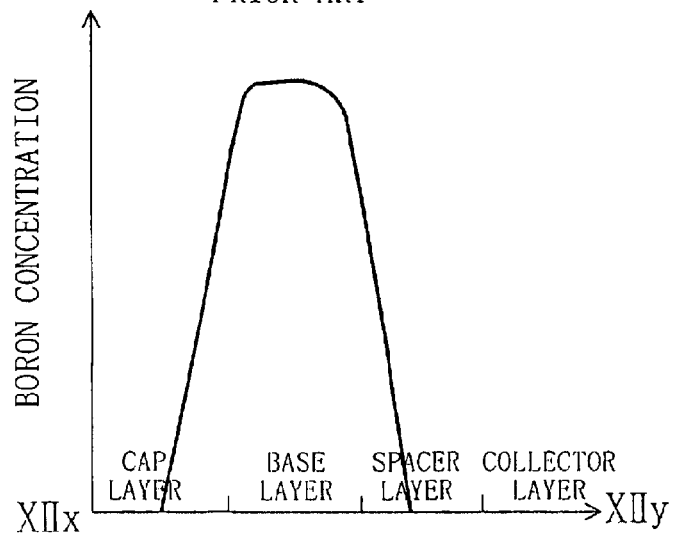

Also, as shown in FIG. 2(b), the upper part of the Si-cap layer 153 is doped with boron at a concentration of approximately $1 \times 10^{18}$ atoms·cm$^{-3}$ and the lower part of the Si-cap layer 153 is doped with boron at a concentration of approximately $2 \times 10^{18}$ atoms·cm$^{-3}$ by out-diffusion from the graded SiGe base layer 152. Meanwhile, the middle part of the Si-cap layer 153 is hardly doped with boron. Hence, a pn junction is formed between the emitter diffusion layer 153a and the peripheral layer 153b surrounding the same, and a depletion layer 154 is formed at a region extending from a first depletion layer end to a second depletion layer end by sandwiching the metallurgical pn junction interface in the pn junction region. A part of the depletion layer 154 in close proximity to the second deposition oxide layer 112 is of a shape shifted toward the center in comparison with the shape of the depletion layer 554 in the conventional HBT (see FIG. 12(a)).

According to the SiGe-HBT of the present invention, as shown in FIG. 2(a), the upper part (a region underneath the second deposited oxide film 112) of the Si-cap layer 153 is doped with boron at a high concentration, and the width of the depletion layer 154 (a distance from the first depletion layer edge to the second depletion layer edge) is narrowed particularly in the upper part of the Si-cap layer 153. As a result, a quantity of carriers diffused and recombined within the depletion layer 154 is reduced, and so is the recombination current.

Figure 11A:
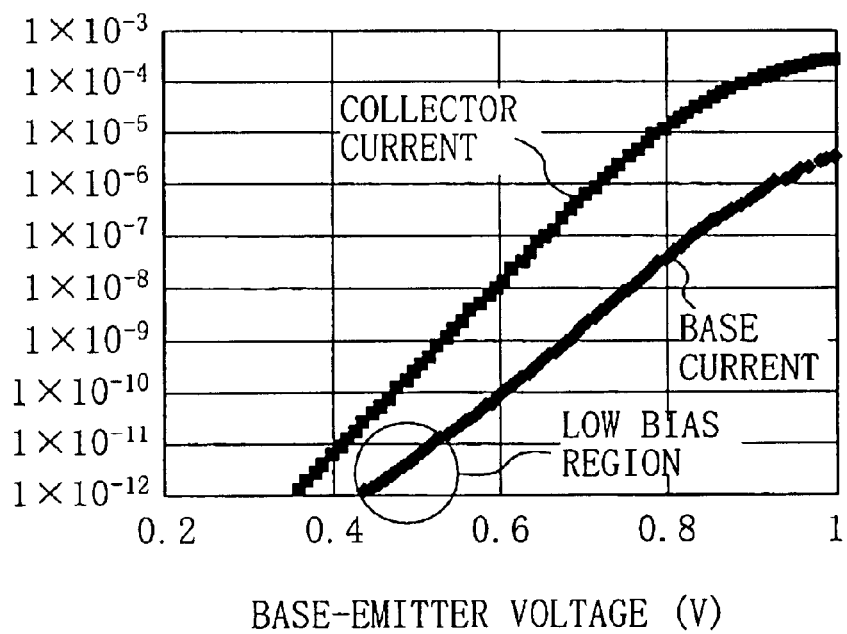
FIGS. 11(a) and 11(b) are views showing dependencies of a base current and a collector current on a base-emitter voltage of a conventional bipolar transistor and of a HBT fabricated according to the third embodiment of the present invention, respectively.
Figure 11B:
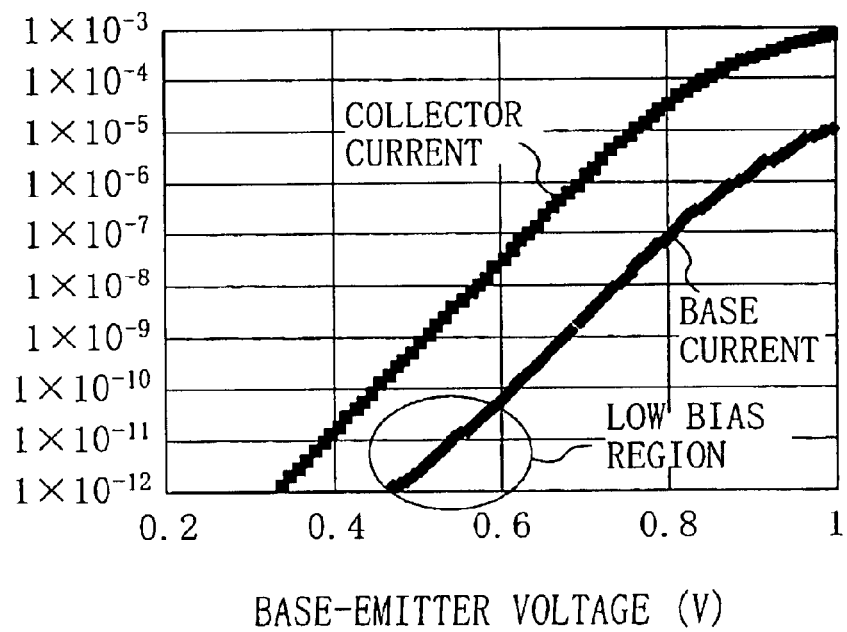

FIG. 11(b) is a view showing dependencies of a base current and a collector current on a base-emitter voltage (Gummel characteristics) of a HBT fabricated according to a third embodiment of the present invention, which will be described below. In the drawing, the horizontal axis represents the base-emitter voltage (V), and the vertical axis represents the base current or collector current (A) (logarithmic scales). As is shown in the drawing, the parallel relation between the collector current characteristics curve and the base current characteristics curve is maintained in a relatively satisfactory manner along an extensive region from the low bias region to the high bias region. In short, the drawing reveals that it is possible to obtain a HBT with a satisfactory linearity.

Hence, according to the present invention, as shown in FIG. 2(a), by doping boron into the upper part of the Si-cap layer 153 at a relatively high concentration, it is possible to control an expansion of the depletion layer. As a result, it is assumed that a recombination current resulting from recombination of carriers within the depletion layer is controlled and hence the Gummel characteristics are improved, thereby making it possible to obtain a HBT with a satisfactory linearity.

Also, there is a possibility that the density of the interface traps at the interface between the top end portion of the Si-cap layer 153 and the second deposited oxide film 112 is lowered of by doping boron, and such a lowered density of interface traps may possibly contribute to the improvement of the linearity of the HBT. The reason is as follows. That is, in a homo Si-type bipolar transistor, it is relatively easy to lower the interface level between the second deposited oxide film 112 and the Si-cap layer 153 by annealing, which is a heat treatment at a relatively high temperature (for example, at approximately 900° C.). However, it is difficult to apply such a high-temperature heat treatment to the SiGe-HBT, and therefore, it is ideal if the density of the interface traps can be lowered by doping boron. In addition, by reducing a density at the interface traps, the recombination rate U in the above expression can be lowered, thereby making it possible to further reduce the recombination current.

It should be appreciated that the thickness of each layer specified above is a typical value, and the thickness can be changed appropriately as needed depending on the kinds and purposes of the HBT.

Next, the following description will describe embodiments of a fabrication method to realize the structure shown in FIG. 1 and FIG. 2(a).

First Embodiment

Initially, the following description will describe, with reference to FIGS. 3(a) through 6(b), a basic flow of the fabrication sequence of a HBT according to a first embodiment.

Figure 3A:
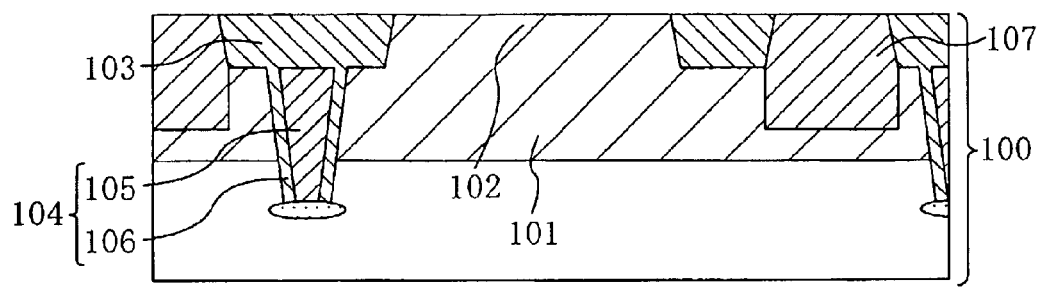
FIGS. 3(a) and 3(b) are cross sections showing steps of forming a Si/Si$_{1-x}$Ge$_x$ layer at a collector opening portion during the fabrication sequence of a semiconductor device according to a first embodiment.

Firstly, in the step shown in FIG. 3(a), an N-type retrograde well 101 with a depth of approximately 1 μm is formed on the top portion of a Si substrate 100 having a (001) plane by conducting epitaxial growth of a Si single crystal layer while doping an N-type impurity, or conducting high-energy ion implantation after the epitaxial growth. It should be appreciated, however, that the retrograde well 101 may be formed by conducting ion implantation at a part of the Si substrate 100 without the epitaxial growth. At this point, a region in the vicinity of the surface of the Si substrate 100 is arranged to have a concentration of the N-type impurity at approximately $1 \times 10^{17}$ atoms·cm$^{-3}$, so that the area will serve as a collector layer of a HBT.

Then, for the isolation, provided are a shallow trench 103 filled with silicon oxide and a deep trench 104 formed from an undoped polysilicon film 105 and a silicon dioxide film 106 surrounding the same. The trenches 103 and 104 have depths of approximately 0.35 μm and 2 μm, respectively. Here, a region in the Si substrate 100 sandwiched by the trenches 103 serves as a collector layer 102. Also, an N+ collector connecting layer 107 is provided in the Si substrate 100 at a region separated from the collector layer 102 by the shallow trench 103 for establishing a contact with a collector electrode.

Thereafter, although it is not shown in the drawing, a gate insulator film, a gate electrode, source and drain regions, etc. forming a basic structure of each MISFET of a CMOS device are formed by a standard fabrication method.

Figure 3B:
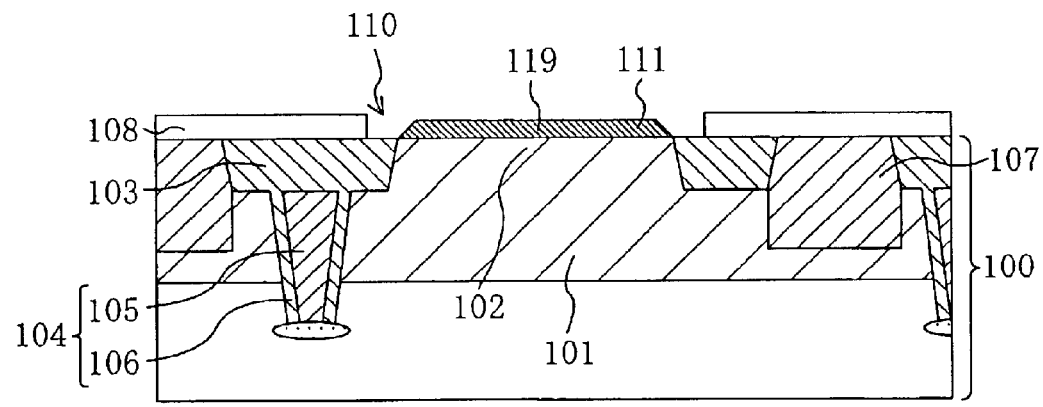

Then, in the step shown in FIG. 3(b), a first deposited oxide film 108 with a thickness of approximately 30 nm is formed on the wafer by chemical vapor deposition (CVD) at a treatment temperature of 680° C. by using tetraethoxysilane (TEOS) and oxygen, after which a collector opening portion 110 having a width wider than the width of an active region is formed through the first deposited oxide film 108 by means of wet etching using a hydrofluoric acid or the like. In other words, by forming the collector opening portion 110 so as to include the interface between the shallow trench 103 and the surface portion of the Si substrate 100, the width of the collector opening portion 110 is maintained wider than the width of the active region. The width of the collector opening portion 110 is substantially the same as the one in the conventional HBT. However, because an interval between the shallow trenches 103 is narrower than in the conventional HBT, the width of the collector opening portion 110 becomes wider than the width of the active region as a result.

Then, a portion of the Si substrate 100 exposed to the collector opening portion 110 is treated with a mixed liquid of ammonia solution and hydrogen peroxide, so that a protector oxide film with a thickness of approximately 1 nm is formed on the treated portion, under which condition the wafer is introduced into a chamber of a UHV-CVD apparatus. Then, after the wafer is introduced, the protector oxide film is removed by heat treatment in a hydrogen atmosphere, after which the wafer is kept heated at 550° C., so that a $Si_{1-x}Ge_x$ layer with a thickness of approximately 80 nm is grown through epitaxial growth on the surface of the Si substrate 100 exposed to the collector opening portion 110 by the method specified in each of the embodiments described below by using a gas including disilane ($Si_2H_6$), germane ($GeH_4$), diborane ($B_2H_6$) for use of doping, etc. as occasion demands. After the $Si_{1-x}Ge_x$ layer is formed, of gases supplied continuously into the chamber, by stopping a supply of germane and using diborane as needed, a Si layer with a thickness of approximately 40 nm is grown through epitaxial growth on the $Si_{1-x}Ge_x$ layer. A $Si/Si_{1-x}Ge_x$ layer 111 is formed from the $Si_{1-x}Ge_x$ layer and the Si layer thus grown.

Figure 4A:
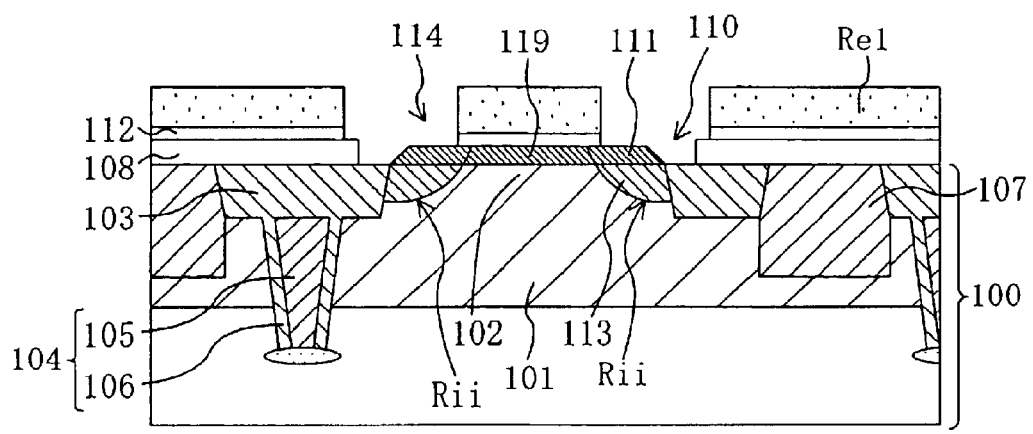
FIGS. 4(a) and 4(b) are cross sections showing the step of forming a base opening portion through a P+ polysilicon layer during the fabrication sequence of the semiconductor device according to the first embodiment.

Then, in the step shown in FIG. 4(a), a second deposited oxide film 112 with a film thickness of 30 nm, which will serve as an etch stopper, is formed on the wafer, after which the second deposited oxide film 112 is patterned by means of dry etching by using a resist mask Re1 provided on the second deposited oxide film 112, whereby a base junction opening portion 114 is formed. At this point, the central portion of the Si/Si$_{1-x}$Ge$_x$ layer 111 is covered with the second deposited oxide film, and the peripheral portion of the Si/Si$_{1-x}$Ge$_x$ layer 111 and a part of the first deposited oxide film 108 are exposed to the base junction opening portion 114. Then, ion implantation of a P-type impurity, such as boron (B), is conducted by using the resist mask Re1 also used in forming the base junction opening portion 114, whereby an extrinsic base implantation region Rii is formed across the surface portions of the Si/Si$_{1-x}$Ge$_x$ layer 111 and the retrograde well 101. At this point, as a part of the extrinsic base implantation region Rii, a junction leakage preventing layer 113 is formed on the surface portion of the retrograde well 101 at a concentration of approximately $3 \times 10^{17}$ atoms·cm$^{-3}$.

Then, in the step shown in FIG. 4(b), a P+ polysilicon layer 115 with a thickness of approximately 150 nm doped at a high concentration of $1 \times 10^{20}$ atoms·cm$^{-3}$ or higher is deposited on the wafer by means of CVD, and subsequently, a third deposited oxide film 117 with a thickness of approximately 100 nm is deposited. Then, the third deposited oxide film 117 and the P+ polysilicon layer 115 are patterned by means of dry etching, whereby a base opening portion 118 that reaches the second deposited oxide film 112 is formed through the third deposited oxide film 117 and P+ polysilicon layer 115 at the center thereof. The base opening portion 118 is smaller than the central portion of the second deposited oxide film 112, and therefore, it never happens that the base opening portion 118 extends beyond the base junction opening portion 114. By this step, an extrinsic base 116 is formed from the P+ polysilicon layer 115 and the Si/Si$^{1-x}$Ge$_x$ layer 111 except for the central portion thereof.

Figure 5A:
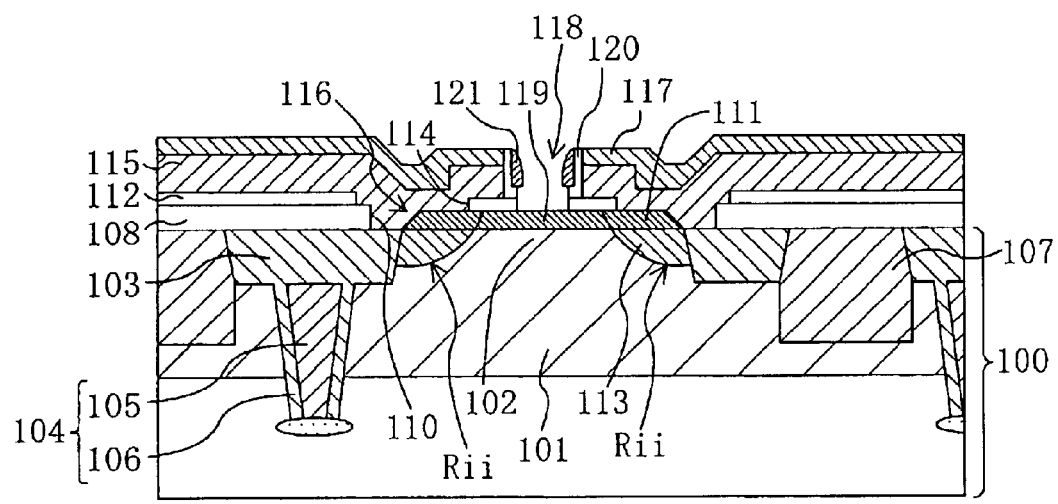
FIGS. 5(a) and 5(b) are cross sections showing the step of forming an N+ polysilicon layer at the base opening portion during the fabrication sequence of the semiconductor device according to the first embodiment.

Then, in the step shown in FIG. 5(a), a deposited oxide film with a thickness of approximately 30 nm and a polysilicon film with a thickness of approximately 150 nm are deposited entirely on the wafer by means of CVD. Then, the etch back is applied to the deposited oxide film and the polysilicon film by means of anisotropic dry etching, whereby a sidewall 121 made of silicon is formed on the side surfaces of the P+ polysilicon layer 115 and the third deposited oxide film 117 by sandwiching the fourth deposited oxide film 120 in between. Then, exposed portions of the second deposited oxide film 112 and the fourth deposited oxide film 120 are removed by means of wet etching using a hydrofluoric acid or the like. At this point, the Si layer on the top of the Si/Si$^{1-x}$Ge$_x$ layer 111 is exposed to the base opening portion 118. Also, because the wet etching has isotropy, the second deposited oxide film 112 and the fourth deposited oxide film 120 are also etched away in the lateral direction, which increases the base opening portion 118 in size. In other words, the base opening width is determined by a quantity of wet etching applied at this point. At the time of this wet etching, even if a SiGe island 111 is adhering to the first deposited oxide film 108, the surface of the Si substrate 100 is never exposed, because the N+ collector connecting layer 107 or the like on the Si substrate 100 is covered with the P+ polysilicon layer 115.

Figure 5B:
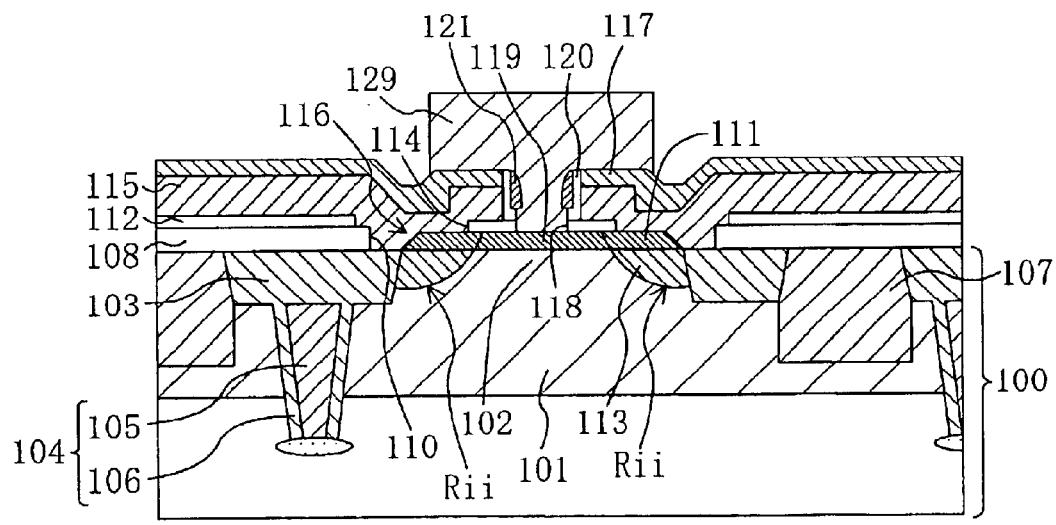

Then, in the step shown in FIG. 5(b), after an N+ polysilicon layer 129 with a thickness of approximately 250 nm is deposited, the N+ polysilicon layer 129 is patterned by means of dry etching, whereby an emitter connecting electrode is formed. At this point, the P+ polysilicon layer 115 is not patterned, and therefore, the sidewall made of polysilicon is not formed at the outside portions of P+ polysilicon layer 115. In addition, because the surface of the N+ collector connecting layer 107 or the like is not etched away by over etching of the N+ polysilicon layer 129, no irregular projections and depression are formed on the surface of the Si substrate 100.

Figure 6A:
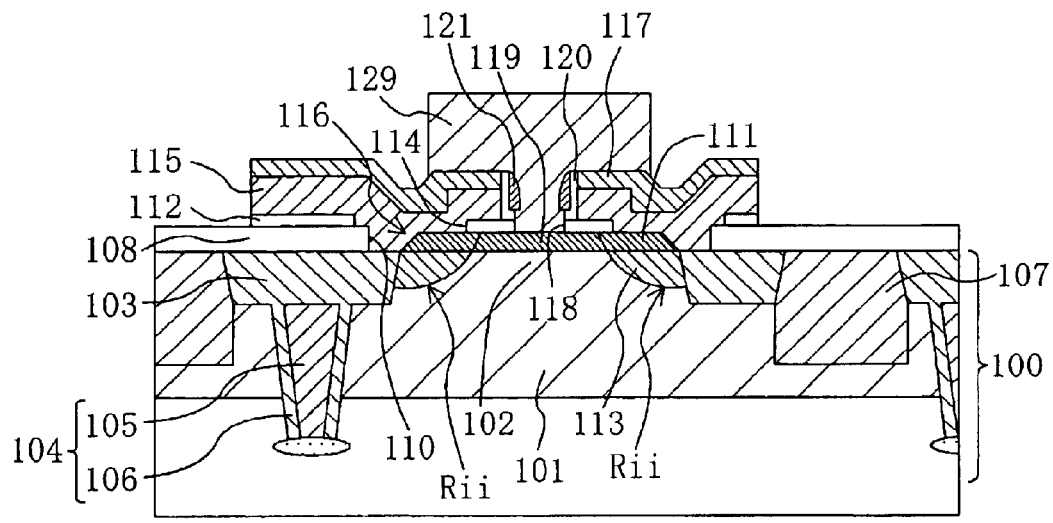
FIGS. 6(a) and 6(b) are cross sections showing the step of patterning P+ polysilicon during the fabrication sequence of the semiconductor device according to the first embodiment.

Then, in the step shown in FIG. 6(a), the third deposited oxide film 117, P+ polysilicon layer 115, and second deposited oxide film 112 are patterned by means of dry etching, whereby the shape of the extrinsic base 116 is determined.

Figure 6B:
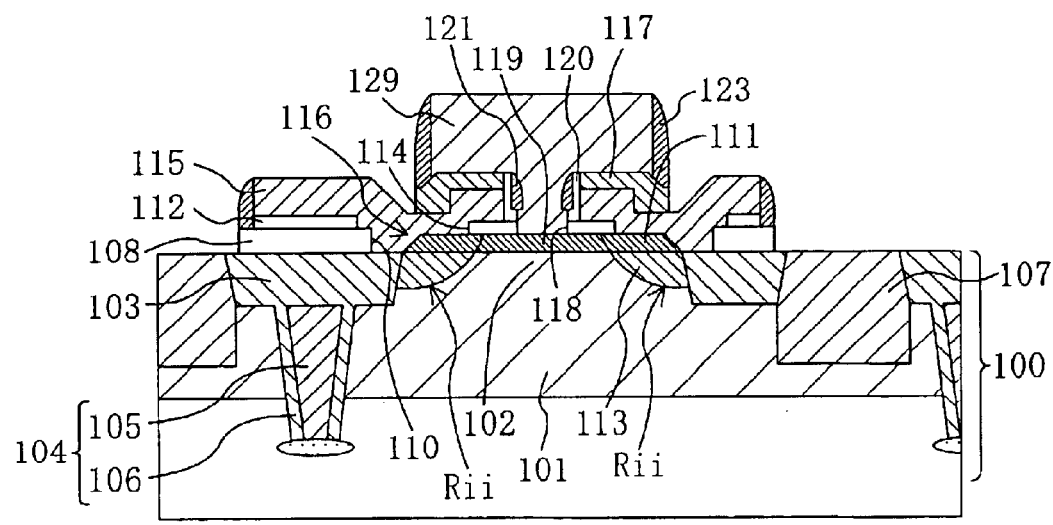

Then, in the step shown in FIG. 6(b), after a deposited oxide film with a thickness of approximately 120 nm is formed on the wafer, a sidewall 123 is formed on the side surfaces of the N+ polysilicon layer 129 and the P+ polysilicon layer 115 by means of dry etching. The exposed portion of the first deposited oxide film 108 is removed also by this dry etching (over etching), whereby the surfaces of the N+ polysilicon layer 129, P+ polysilicon layer 115, and N+ collector connecting layer 107 are exposed.

Further, in order to obtain the structure shown in FIG. 1, the following treatment is applied. That is, after a Ti film with a thickness of approximately 40 nm is deposited on the wafer entirely by means of sputtering in the first place, a Ti silicide layer 124 is formed on the exposed surfaces of the N+ polysilicon layer 129, P+ polysilicon layer 115, and N+ collector connecting layer 107 by RTA (Rapid Thermal Annealing) at 675° C. for 30 seconds. Then, after a non-reactive portion of the Ti film alone is selectively removed, annealing is carried so as to change the crystalline structure of the Ti silicide layer 124.

Then, an inter-layer insulator film 125 is formed on the wafer entirely, through which connection holes that respectively reach the Ti silicide layer 124 formed on the N+ polysilicon layer 129, P+ polysilicon layer 115, and N+ collector connecting layer 107 are provided. Then, W plugs 126 are formed by filling each connection hole with a W film, after which an aluminum alloy film is deposited on the wafer entirely and patterned so as to be connected to each W plug 126, whereby metal wirings 127 extending over the inter-layer insulator film 125 are formed.

According to the steps described above, a HBT having the structure shown in FIG. 1, that is, a HBT provided with a collector made of N-type Si, a base made of P-type Si$_{1-x}$Ge$_x$, and an emitter made of N+ type Si is fabricated. The Si layer in the Si/Si$_{1-x}$Ge$_x$ layer 111 is made into an N+ type Si layer with a high-concentration N-type impurity (for example, phosphorous) out-diffused from the N+ polysilicon layer 129.

Figure 7A:
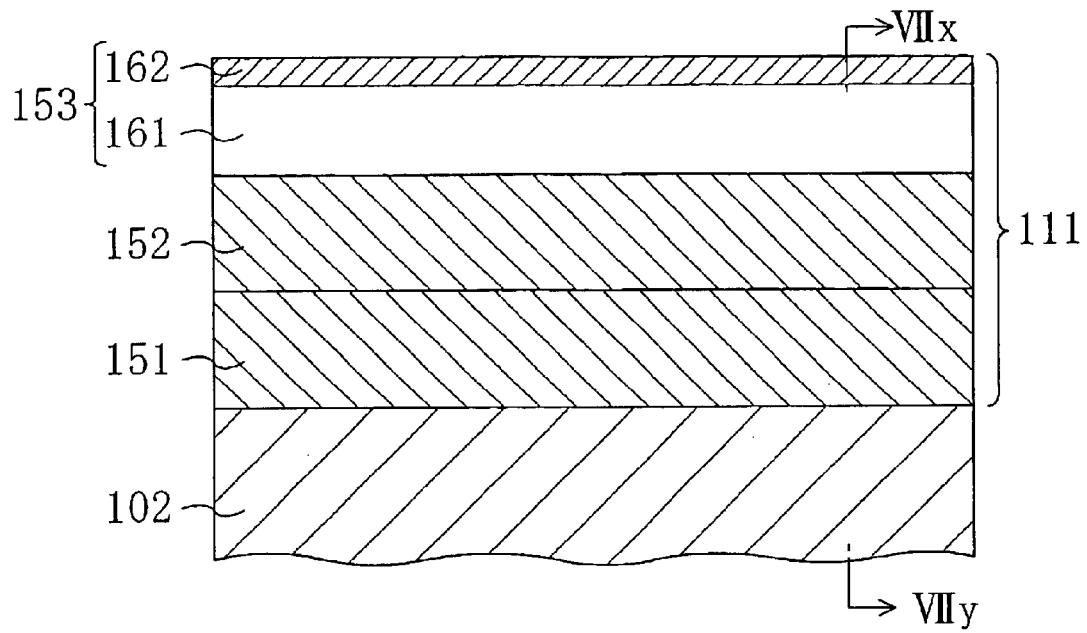
FIGS. 7(a) and 7(b) are views showing the fabrication sequence according to the first embodiment, which are an enlarged partial cross section showing a structure of an emitter-base junction in the step shown in FIG. 3(b), and a view showing a doping profile of boron along the cross section, respectively.
Figure 7B:
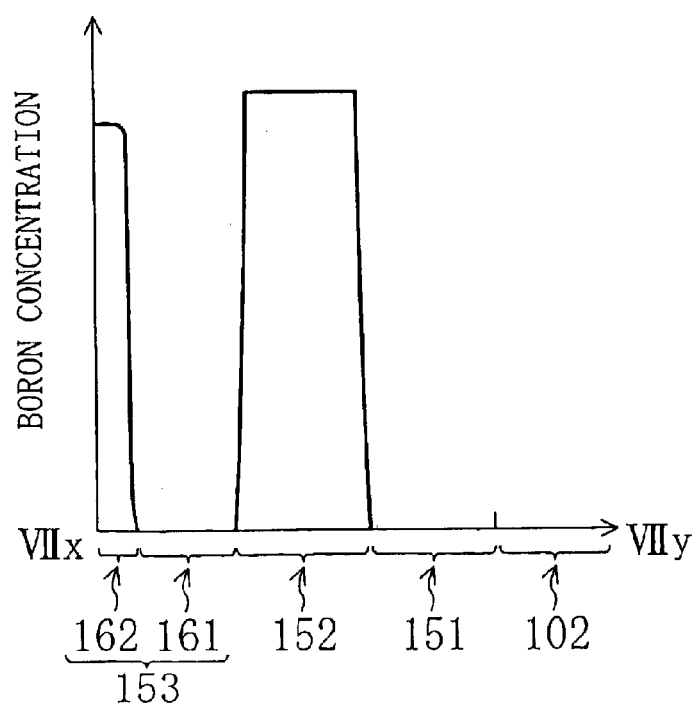

Next, the following description will describe, with reference to FIGS. 7(a) and 7(b), the steps of forming the Si/Si$_{1-x}$Ge$_x$ layer 111, which is the characteristic of the present embodiment. FIGS. 7(a) and 7(b) are an enlarged partial cross section showing an emitter-base junction portion in the step shown in FIG. 3(b) during the fabrication sequence discussed above, and a doping profile of boron along the cross section, respectively.

Initially, a portion of the Si substrate 100 exposed to the collector opening portion 110 is treated with a mixed liquid of ammonia solution and hydrogen peroxide, so that a protector oxide film with a thickness of approximately 1 nm is formed on the treated portion, under which condition the wafer is introduced into a chamber of a UHV-CVD apparatus. After the wafer is introduced into the chamber, the protector oxide film is removed by heating the wafer at 850° C. for two minutes in a vacuum atmosphere. Then, the temperature of the wafer is dropped to 550° C. within the chamber, and disilane (Si$_2$H$_6$) and germane (GeH$_4$) are flown at flow rates of 0.02 l/min. and 0.03 l/min., respectively, and at a pressure of approximately 0.067 Pa, which condition is maintained for two minutes and forty seconds, whereby an undoped SiGe spacer layer 151 with a thickness of approximately 40 nm is formed on the wafer. At this point, the growing rate of the SiGe spacer layer 151 is approximately 15 nm/min.

Subsequently, hydrogen-diluted diborane ($B_2H_6$) with a concentration of 5% is introduced into the chamber at a flow rate of 4 sccm while maintaining the temperature, pressure, and the flow rate of disilane ($Si_2H_6$) inside the chamber intact. Then, by continuously changing a flow rate of germane ($GeH_4$) from 0.03 l/min. to 0 l/min. over four minutes, a graded SiGe base layer 152 with a thickness of approximately 40 nm and with a Ge content x in the mixed crystals $Si_{1-x}Ge_x$ changing from 15% to 0% is grown through epitaxial growth. At this point, an average growing rate of the graded SiGe base layer 152 is approximately 10 nm/min. with a concentration of boron at approximately $4 \times 10^{18}$ atoms·cm$^{-3}$.

Then a supply of hydrogen-diluted diborane ($B_2H_6$) is stopped without flowing germane ($GeH_4$) while maintaining the temperature, pressure, and the flow rate of disilane ($Si_2H_6$) inside the chamber intact, which condition is maintained for 15 minutes, whereby an undoped Si layer 161 with a thickness of 30 nm is grown through epitaxial growth. At this point, a growing rate of the undoped Si layer 161 is approximately 2 nm/min.

Then, hydrogen-diluted diborane ($B_2H_6$) with a concentration of 5% is flown into the chamber again at a flow rate of 0.001 l/min., which condition is maintained for five minutes, whereby a doped Si layer 162 with a thickness of approximately 10 nm is grown through epitaxial growth. At this point, a growing rate of the doped Si layer 162 is approximately 2 nm/min. with a concentration of boron at $1 \times 10^{18}$ atoms·cm$^{-3}$.

When the steps described above are completed, the Si-cap layer 153 is formed from the undoped Si layer 161 and the doped Si layer 162. Also, the Si/Si$_{1-x}$Ge$_x$ layer 111 is formed from the SiGe spacer layer 151, graded SiGe base layer 152, and Si-cap layer 153.

FIG. 7(b) shows a doping profile of boron immediately after the formation of the Si/Si$_{1-x}$Ge$_x$ layer 111 and before the heat treatment. Under these conditions, the doping profile is extremely abrupt with high-concentration boron being present only in the graded SiGe base layer 152 and in the doped Si layer 162 of the Si-cap layer 153.

Then, by applying heat treatment in each step in the sequence thereafter, boron doped into the graded SiGe base layer 152 and into the doped Si layer 162 of the Si-cap layer 153 is out-diffused, and eventually a doping profile of boron as shown in FIG. 2(b) is shaped.

The present embodiment is characterized in that boron is doped when the Si-cap layer is formed, that is, CVD is conducted by in-situ doping. Thus, according to the present embodiment, by conducting in-situ doping, it is possible to control a concentration of boron doped in the upper part of the Si-cap layer 153 at a relatively high accuracy.

Second Embodiment

In the present embodiment, the basic flow of the fabrication sequence of a HBT is the same as described in the first embodiment with reference to FIGS. 2(a) through 6(b).

Figure 8A:
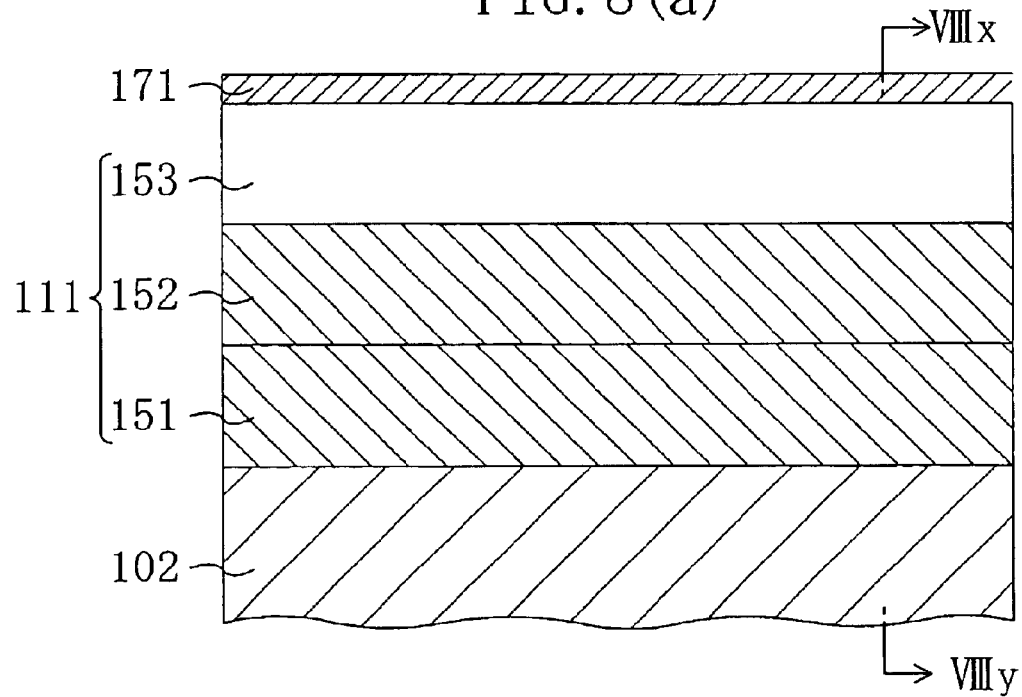
FIGS. 8(a) and 8(b) are views showing the fabrication sequence according to a second embodiment, which are an enlarged partial cross section showing a structure of an emitter-base junction in the step shown in FIG. 4(a), and a view showing a doping profile of boron along the cross section, respectively.
Figure 8B:
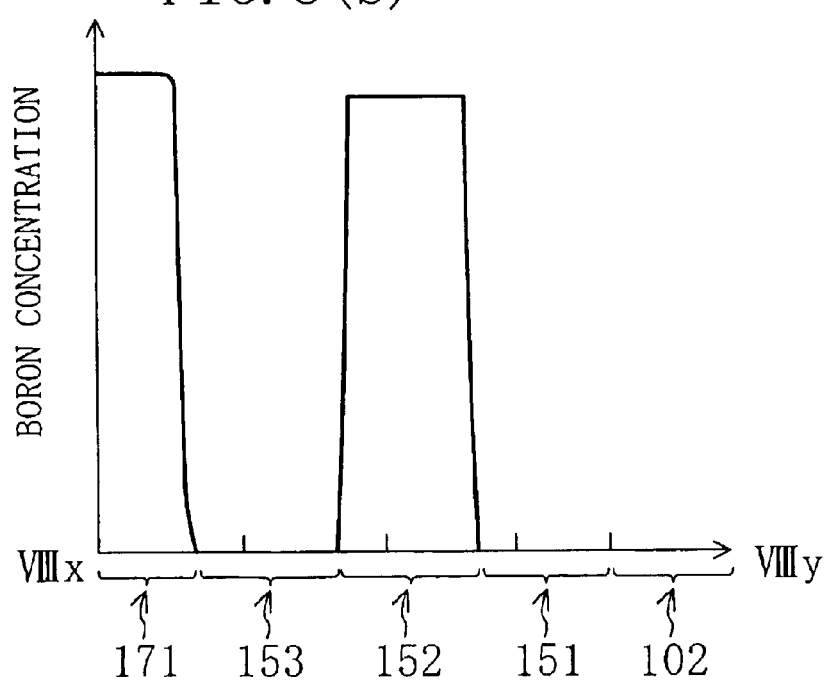

The present embodiment is characterized in that the step shown in FIG. 4(a) is carried on as described below. FIGS. 8(a) and 8(b) are an enlarged partial cross section showing an emitter-base junction in the step shown in FIG. 4(a) during the fabrication sequence discussed above, and a doping profile of boron along the cross section, respectively.

In the present embodiment, the treatment is applied in the same manner as was discussed in the first embodiment, whereby formed on the collector layer 102 are an undoped SiGe spacer layer 151 with a thickness of approximately 40 nm and a graded SiGe base layer 152 including boron at a concentration of approximately $4 \times 10^{18}$ atoms·cm$^{-3}$ with a thickness of approximately 40 nm.

Then, a supply of hydrogen-diluted diborane ($B_2H_6$) is stopped without flowing germane ($GeH_4$) while maintaining the temperature, pressure, and the flow rate of disilane ($Si_2H_6$) inside the chamber intact since the formation of the graded SiGe base layer 152, which condition is maintained for 20 minutes, whereby a Si-cap layer 153 with a thickness of approximately 40 nm is grown through epitaxial growth.

Then, instead of the second deposited oxide film 112 in the first embodiment, a second deposited oxide film 171 formed from a boron-doped silicon dioxide film (BSG film) is deposited on the Si-cap layer 153. At this point, the temperature of the wafer is raised to 400° C. in the chamber of an AP-CVD apparatus, and under atmospheric pressure, tetraethoxysilane (TEOS) is flown at a flow rate of 1.5 l/min., triethoxyborane (TEB) is flown at a flow rate of 1.5 l/min., $O_2$ including ozone at a concentration of 85·g/Nm$^3$ is flown at a flow rate of 7.5 l/min., and $N_2$ is flown at a flow rate of 18.0 l/min., which condition is maintained for 15 seconds, whereby the second deposited oxide film 171 containing 3 wt % of boron with a thickness of approximately of 30 nm is formed.

FIG. 8(b) is a view showing a doping profile of boron along the longitudinal cross section at this point. Under these conditions, boron is not doped in the Si-cap layer 153. However, boron is out-diffused into the upper part of the Si-cap layer 153 from the second deposited oxide film 171 by heat treatments in the sequence thereafter, and eventually the doping profile of boron as shown in FIG. 2(a) is shaped.

Then, after a base junction opening portion 114 is formed through the second deposited oxide film 171 in the same manner as was in the step shown in FIG. 4(a), the steps shown in FIGS. 4(b) through 6(b) are carried on, whereby a HBT having the structure shown in FIG. 1 is obtained.

It is needless to say that a PSG film is used as the second deposited oxide film 171 for a PNP bipolar transistor.

According to the present embodiment, it is possible to dope boron into the Si-cap layer 153 with relatively simple steps. In particular, the present embodiment is assumed to have a good possibility of lowering the interface traps between the top end portion of the Si-cap layer 153 and the second deposited oxide film 112.

Third Embodiment

In the present embodiment, the basic flow of the fabrication sequence of a HBT is the same as described in the first embodiment with reference to FIGS. 2(a) through 6(b).

Figure 4B:
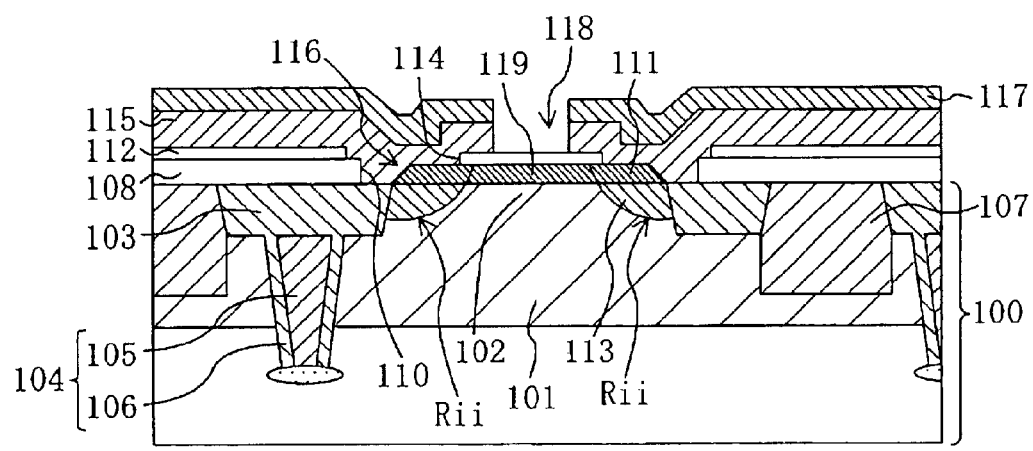
Figure 9A:
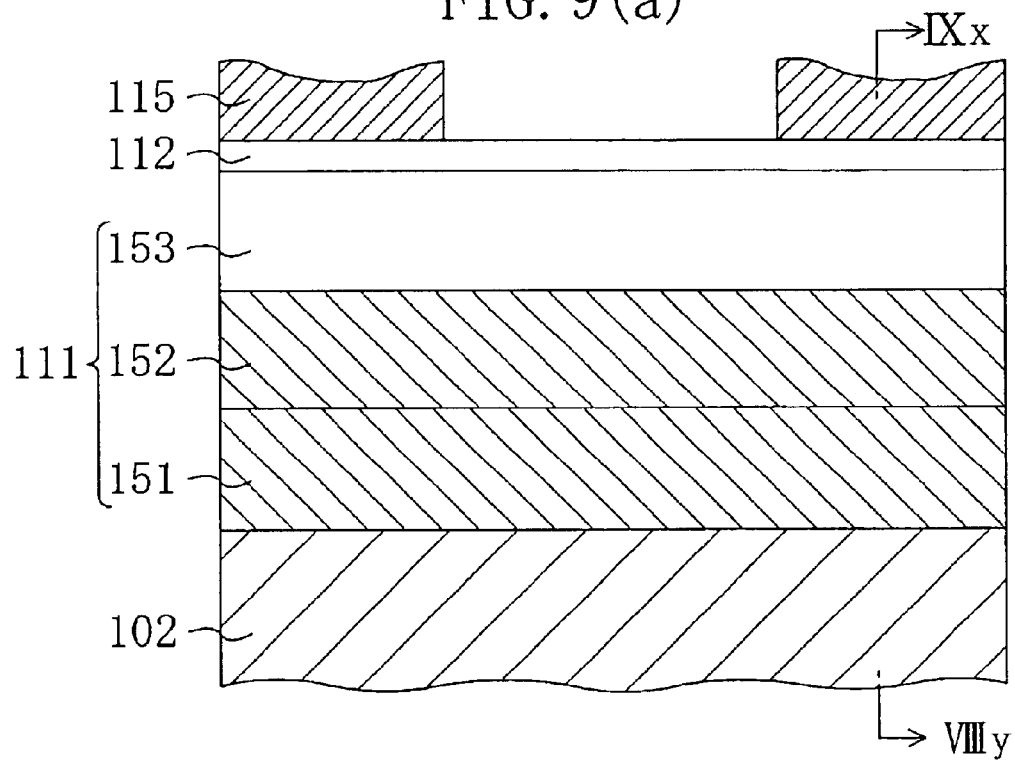
FIGS. 9(a) and 9(b) are views showing the fabrication sequence according to a third embodiment, which are an enlarged partial cross section showing a structure of an emitter-base junction in the step shown in FIG. 4(a), and a view showing a doping profile of boron along the cross section, respectively.
Figure 9B:
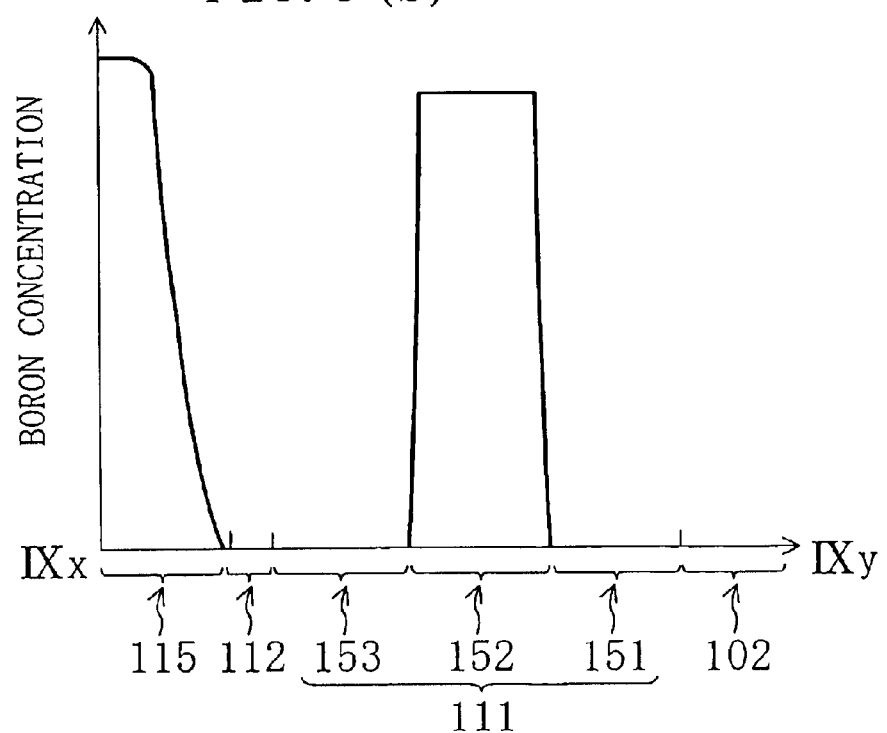
Figure 10:
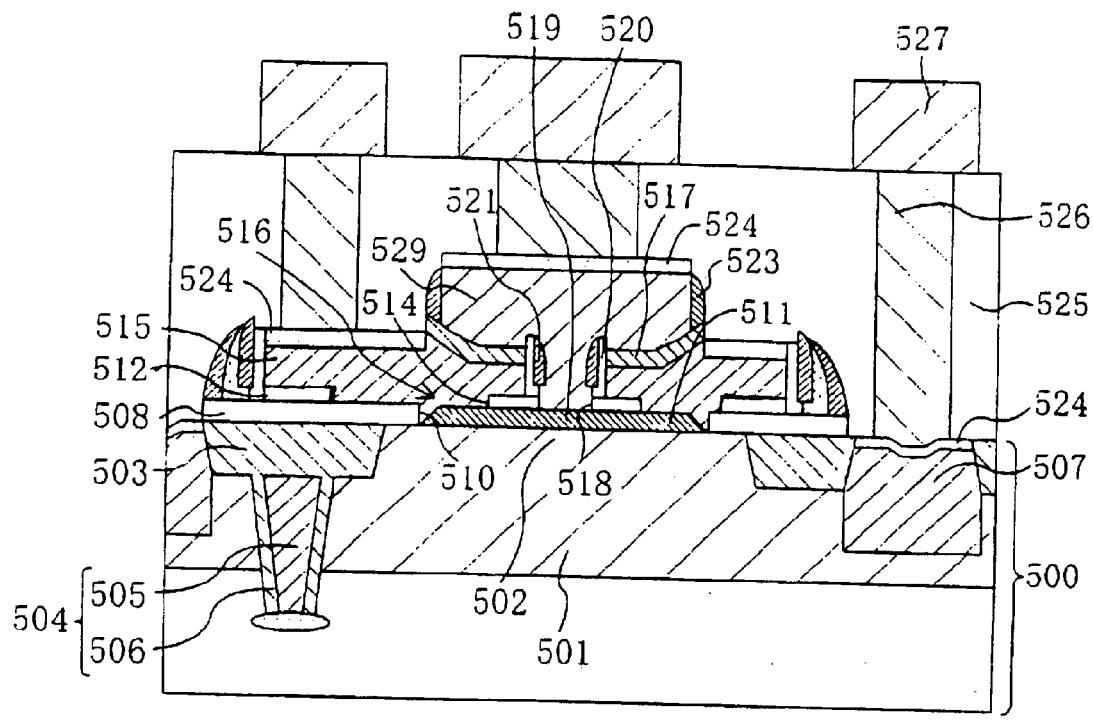
FIG. 10 is a cross section showing a structure of a conventional HBT.

The present embodiment is characterized in that the steps shown in FIGS. 4(a) and 4(b) are conducted as described below. FIGS. 9(a) and 9(b) are an enlarged partial cross section showing an emitter-base junction in the steps shown in FIGS. 4(a) and 4(b) during the fabrication sequence discussed above, and a doping profile of boron along the cross section, respectively.

In the present embodiment, the treatment is applied in the same manner as was discussed in the first embodiment, whereby formed on the collector layer 102 are an undoped SiGe spacer layer 151 with a thickness of approximately 40 nm and a graded SiGe base layer 152 including boron at a concentration of approximately 4×10¹⁸ atoms·cm⁻³ with a thickness of approximately 40 nm.

Then, a supply of hydrogen-diluted diborane ($B_2H_6$) is stopped without flowing germane ($GeH_4$) while maintaining the temperature, pressure, and the flow rate of disilane ($Si_2H_6$) inside the chamber intact since the formation of the graded SiGe base layer 152, which condition is maintained for 20 minutes, whereby a Si-cap layer 153 with a thickness of approximately 40 nm is grown through epitaxial growth.

Then, the treatment is applied in substantially the same manner as was in the first embodiment, so that a second deposited oxide film 112 that will serve as an etch stopper is formed on the wafer. At this point, the thickness of the second deposited oxide film 112 is 10 nm in the present embodiment.

Then, by applying the treatment described in the first embodiment, a base junction opening portion 114 is formed through the second deposited oxide film 112 by patterning the same, and ion implantation of boron (B) is conducted by using a resist mask also used in forming the base junction opening portion 114.

Then, as was described in the step shown in FIG. 4(b), a P+ polysilicon layer 115 with a thickness of approximately 150 nm is deposited on the wafer by means of CVD. However, a concentration of boron in the P+ polysilicon layer 115 is $2 \times 10^{20}$ atoms·cm⁻³ or higher in the present embodiment. This is because with the above specified concentration of boron, after an undoped silicon film is deposited, it is possible to conduct ion implantation of boron into the polysilicon film under the conditions: an accelerating voltage of approximately 8 keV and a dosage of approximately $5 \times 10^{15}$ atoms s·cm⁻². It should be noted, however, that in-situ doping may be conducted while the polysilicon film is deposited. Subsequently, by applying the treatment in the same manner as was in the first embodiment, a third deposited oxide film 117 (see FIG. 4(b)) is deposited, and a base opening portion 118 is provided through the third deposited oxide film 117 and the P+ polysilicon layer 115 by patterning the same. Then, an extrinsic base 116 (see FIG. 4(b)) is formed from the P+ polysilicon layer 115 and the $Si/Si_{1-x}Ge_x$ layer 111 except for the central portion thereof.

FIG. 9(b) is a view showing a doping profile of boron along the longitudinal cross section at this point. Under these conditions, boron is not doped in the Si-cap layer 153, and high-concentration boron is doped in the P+ polysilicon layer 115 (a part of the extrinsic base layer 116) alone, which is separated from the Si-cap layer 153 by the second deposited oxide film 112., However, boron in the P+ polysilicon layer 115 is out-diffused into the upper part of the Si-cap layer 153 by passing through the second deposited oxide film 112 by heat treatments in the sequence thereafter, and eventually the doping profile of boron as shown in FIG. 2(a) is shaped.

Then, by conducting the steps shown in FIGS. 5(a) through 6(b), a HBT having the structure shown in FIG. 1 is obtained.

According to the present embodiment, it is arranged in such a manner that boron is doped into the upper part of the Si-cap layer 153 from the P+ polysilicon layer 115 after the base opening portion 118 is formed. Hence, it is possible to introduce boron into the Si-cap layer 153 only at a region except for the emitter diffusion layer 153a, which is a region directly below the base opening portion 118, thereby making it unnecessary to concern a concentration relation between boron and phosphorus doped into the emitter diffusion layer 153a. Hence, the present embodiment is advantageous in that a concentration of boron at the upper part of the Si-cap layer 153 can be adjusted to an optimal concentration.

Other Embodiments

The embodiments above described cases where the present invention is applied to a double-polysilicon type HBT. It should be appreciated, however, that the present invention is not limited to the embodiments above, and the first and second embodiments can be applied to a single-polysilicon type HBT as well. In such a case, the N+ polysilicon layer 115 is omitted, and the $Si/Si_{1-x}Ge_x$ layer 111 is arranged so as to extend over the first deposited oxide film 108, while the second deposited oxide film 112 is removed except for a portion surrounding the base opening portion 118. At this point, a portion of the $Si/Si_{1-x}Ge_x$ layer 111 positioned on the first deposited oxide film 108 has a polycrystalline structure instead of a single crystalline structure. However, because this portion functions as the extrinsic base, it only has to function merely as a resistor. Therefore, the crystalline structure does not cause any inconvenience in the operation and the characteristics of the HBT.

According to the method in each of the embodiments above, as shown in FIG. 2(b), boron is doped into the bottom part of the Si-cap layer 153 also by diffusion. However, boron may be doped by in-situ doping at the bottom part of the Si-cap layer 153 in each of the embodiments above.

Also, each of the embodiments above described the NPN type HBT as an example. It is needless to say, however, that the present invention is also applicable to a PNP type HBT. In such a case, the conductive type of each component in the HBT, and the conductive type of impurities doped into each component in the HBT are revered from those specified in each of the embodiments above.

In addition, it is possible to obtain a so-called BiCMOS device by fabricating the SiGe-HBT of the present invention and a Si-CMOSFET on a common Si substrate.

The SiGe spacer layer and the graded SiGe base layer used in each of the embodiments above may be replaced with a SiGeC spacer layer and a graded SiGeC base layer.

In the first through third embodiments, the $Si/Si_{1-x}Ge_x$ layer 111 may extend over the first deposited oxide film 108.

(Modified Example of the Structure)

In the structure shown in FIG. 1, the base layer is formed from a $Si_{1-x}Ge_x$ layer ($0 \leq x < 1$). However, the base layer may be formed from a $Si_{1-x-y}Ge_xC_y$ layer ($0 \leq x, y < 1$), or a $Si_{1-y}C_y$ layer ($0 \leq y < 1$) instead of the $Si_{1-x}Ge_x$ layer. Alternatively, at least one of the emitter and collector is formed from the $Si_{1-x}Ge_x$ layer, $Si_{1-x-y}Ge_xC_y$ layer, or $Si_{1-y}C_y$ layer.

Figure 13:
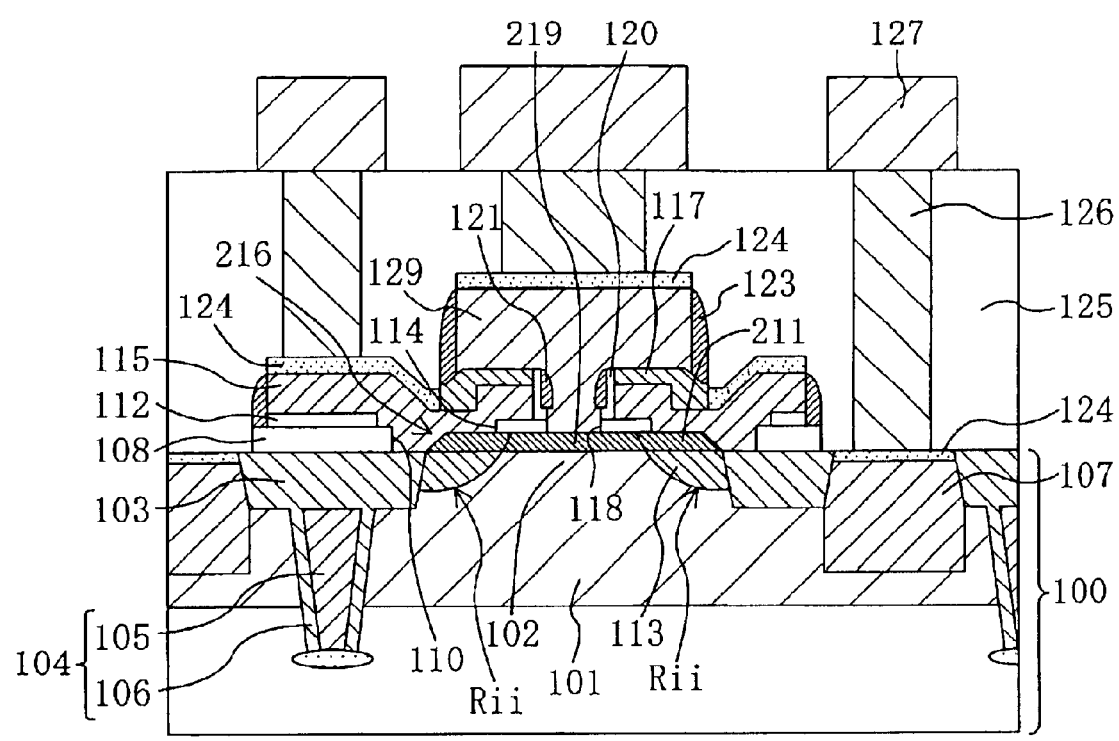
FIG. 13 is a cross section showing an arrangement of a bipolar transistor as a semiconductor device fabricated according to a modified example of the basic structure of the present invention.

FIG. 13 is a cross section of a hetero bipolar transistor (HBT) according to a modified example, in which the $Si_{1-x}Ge_x$ layer is replaced with the $Si_{1-x-y}Ge_xC_y$ layer in the basic structure. The structure of the HBT according to this modified example is almost the same as the structure of the HBT shown in FIG. 1 except for the following.

A $Si/Si_{1-x-y}Ge_xC_y$ layer 211 formed by depositing a $Si_{1-x-y}Ge_xC_y$ layer doped with a P-type impurity with a thickness of approximately 80 nm and a Si film with a thickness of approximately 40 nm is provided to the top surface of the Si substrate 100 at a portion exposed to the collector opening portion 110. The $Si/Si_{1-x-y}Ge_xC_y$ layer 211 is formed by selective growth on the Si substrate 100 only at the portion exposed to the collector opening portion 110. Then, the bottom portion at the center of the $Si/Si_{1-x-y}Ge_xC_y$ layer 211 (a region below a base opening portion 118, which will be described below) functions as an intrinsic base 219. On the other hand, the top portion at the center of the Si/Si$_{1-x-y}$Ge$_x$C$_y$ layer 211 functions as an emitter layer. In regard to a more detailed structure of the Si/Si$_{1-x-y}$Ge$_x$C$_y$ layer 211, the impurity profile described in the first through third embodiments is applicable. An extrinsic base implantation region Rii is formed by ion implantation of boron across the surface portions of the Si/Si$_{1-x-y}$Ge$_x$C$_y$ layer 211 and the retrograde well 101. Also, a second deposited oxide film 112 with a thickness of approximately 30 nm to serve as an etch stopper is provided on the Si/Si$_{1-x-y}$Ge$_x$C$_y$ layer 211 and the first deposited oxide film 108, and the second deposited oxide film 112 is provided with a base junction opening portion 114 and a base opening portion 118. Provided next are a P+ polysilicon layer 115 with a thickness of approximately 150 nm that fills in the base junction opening portion 114 and extends over the second deposited oxide film 112, and a third deposited oxide film 117. An extrinsic base layer 216 is formed from the Si/Si$_{1-x-y}$Ge$_x$C$_y$ layer 211 except for a region below the base opening portion 118 and the P+ polysilicon layer 115.

The other members shown in FIG. 13 are the same as those used in the structure shown in FIG. 1, and a description of these members is omitted by labeling like reference numerals with respect to FIG. 1. In the fabrication sequence, the Si$_{1-x-y}$Ge$_x$C$_y$ layer is grown through epitaxial growth instead of the Si$_{1-x}$Ge$_x$ layer grown through epitaxial growth in the first through third embodiments.

Industrial Applicability

The semiconductor device of the present invention is used as a device, such as a bipolar transistor incorporated into an electronic device, and in particular, as a device handling a high frequency signal.

What is claimed is:

1. A bipolar transistor, comprising:
    a first semiconductor layer to be a collector layer formed on a substrate and including an impurity of a first conductive type;
    a second semiconductor layer to be a base layer formed on said first semiconductor layer and including an impurity of a second conductive type;
    a third semiconductor layer formed on said second semiconductor layer from a material having a bandgap different from a bandgap of said second semiconductor layer;
    an insulator film provided on said third semiconductor layer;
    an opening portion formed through said insulator film to reach said third semiconductor layer; and
    an emitter connecting electrode made of a conductor material and brought into contact with said third semiconductor layer by filling said opening portion in said insulator film,
    wherein said third semiconductor layer includes an emitter diffusion layer of the first conductive type positioned below said opening portion, and a peripheral layer located at a side of said emitter diffusion layer, and
    said peripheral layer includes the impurity of the second conductive type so as to be distributed at a high concentration in an upper part, at a low concentration at the center and at a high concentration in a lower part within the peripheral layer.

2. The bipolar transistor according to claim 1, wherein:
    said insulator film is formed from a silicon dioxide film doped with the impurity of the second conductive type; and
    the impurity of the second conductive type included in at least a part of the top portion of said third semiconductor layer is the impurity of the second conductive type out-diffused from said insulator film.

3. The bipolar transistor according to claim 1, further comprising:
    a polysilicon film, doped with the impurity of the second conductive type and provided so as to contact said third semiconductor layer at a portion located outside of said insulator film and to extend over said insulator film, for functioning as a base connecting electrode,
    wherein the impurity of the second conductive type included in at least a part of the top portion of said third semiconductor layer is the impurity of the second conductive type out-diffused from said polysilicon film by passing through said insulator film.

4. The bipolar transistor according to claim 1, wherein the impurity of the first conductive type in the emitter diffusion layer of said third semiconductor layer is the impurity of the first conductive type out-diffused from said emitter connecting electrode.

5. The bipolar transistor according to claim 1, wherein:
    said substrate is a silicon substrate;
    said first semiconductor layer is a Si layer;
    said second semiconductor layer is a SiGe layer or a SiGeC layer; and
    said third semiconductor layer is a Si layer.

* * * * *

UNITED STATES PATENT AND TRADEMARK OFFICE
CERTIFICATE OF CORRECTION

PATENT NO. : 6,828,602 B2
DATED : December 7, 2004
INVENTOR(S) : Akira Asai et al.

It is certified that error appears in the above-identified patent and that said Letters Patent is hereby corrected as shown below:

Title page,
Item [75], Inventors, change the second inventor's city of residence from "Hirakata" to -- Osaka --.

Signed and Sealed this

Seventeenth Day of May, 2005

JON W. DUDAS
*Director of the United States Patent and Trademark Office*